United States Patent [19]

Kamamori et al.

[11] Patent Number: 4,617,094

[45] Date of Patent: Oct. 14, 1986

[54] METHOD OF MANUFACTURING SOLID STATE COLOR FILTER DEVICE USES CO-ELECTRODEPOSITION

[75] Inventors: Hitoshi Kamamori; Mitsuru Suginoya; Koji Iwasa; Yutaka Sano; Yumiko Terada, all of Tokyo, Japan

[73] Assignee: Seiko Instruments & Electronics Ltd., Tokyo, Japan

[21] Appl. No.: 633,864

[22] Filed: Jul. 24, 1984

[30] Foreign Application Priority Data

Aug. 4, 1983 [JP] Japan .................................. 58-142882

[51] Int. Cl.$^4$ ...................... C25D 13/02; C25D 13/06
[52] U.S. Cl. .................................. 204/18.1; 350/313; 204/20; 204/181.1; 204/181.5; 204/180.2; 430/321
[58] Field of Search ........... 204/181 R, 181 F, 181 T, 204/18.1, 181.1, 181.5

[56] References Cited

U.S. PATENT DOCUMENTS

| | | | |
|---|---|---|---|
| 4,400,252 | 8/1983 | Ushigima | 204/181 R |
| 4,416,753 | 11/1983 | Batrill et al. | 204/181 C |
| 4,522,691 | 6/1985 | Sugimoya et al. | 204/18.1 |

*Primary Examiner*—John D. Welsh
*Attorney, Agent, or Firm*—Robert E. Burns; Emmanuel J. Lobato; Bruce L. Adams

[57] ABSTRACT

Disclosed is a method of making a color filter for a solid state imaging device involving forming plural, spaced apart transparent electroconductive layers, insulated from one another, on a substrate and a layer of light absorbing material in the spaces between the spaced-apart layers. Co-electrodeposition of a coloring material and a polymer is used to deposit a colored layer on the electroconductive layers.

11 Claims, 17 Drawing Figures

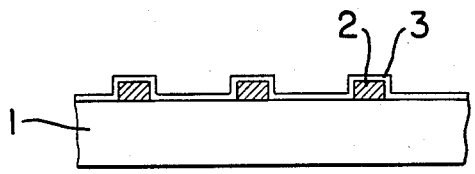
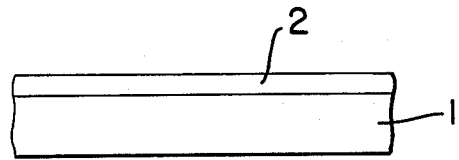
FIG. 1(a)              FIG. 2(a)
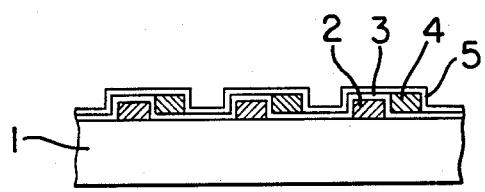
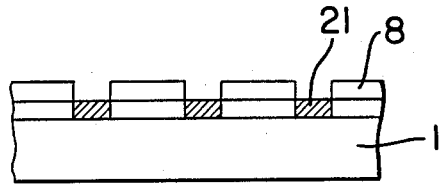
FIG. 1(b)              FIG. 2(b)
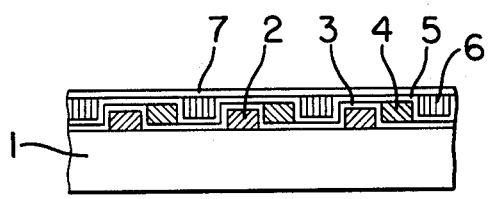
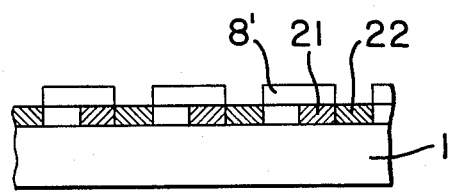
FIG. 1(c)              FIG. 2(c)
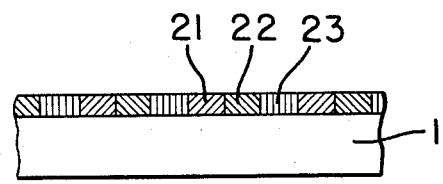
FIG. 2(d)

METHOD OF MANUFACTURING SOLID STATE COLOR FILTER DEVICE USES CO-ELECTRODEPOSITION

BACKGROUND OF THE INVENTION

This invention generally relates to a method of manufacturing a solid state color imaging device which detects incident light so as to produce a color image signal, and more particularly relates to a method of manufacturing the solid state color imaging device incorporating a color filter on the solid state imaging device.

A color television camera consists of one or two solid state imaging devices such as a charge-coupled device, bueket brigade device and metal oxide semiconductor. The solid state imaging device requires a mosaic or stripe-shape color filter for color separation. In these conventional color imaging devices, the color filter formed on the surface of the transparent substrate, such as glass, is disposed on the solid state imaging device while the color filter is precisely aligned so as to fit each imaging element provided on the solid state imaging device. Such alignment is difficult, increases manufacturing cost and reduces yield rate. Therefore in recent years it has been proposed that the color filter be directly installed on the solid state imaging device by the so-called on-chip method.

There are two typical methods for directly forming the color filter on the solid state imaging device.

One manufacturing method is illustrated in FIGS. 1 (a) to (c).

Photosensitive liquid is applied over the surface of a solid state imaging device 1 by a roll coat method, dipping method or spinner method. The photosensitive liquid contains dyeable resin such as polyvinyl alcohol, glue, gelatin and casein and is doped by ammonium bichromate to impart photosensitivity. The applied photosensitive liquid is dried. The photosensitive layer to be dyed with a first color is selectively exposed to light to be cured by using a photo mask. Then the photosensitive layer is developed and removed from the solid state imaging device 1 except for the photochemically cured portion which is to be dyed and which is called a dye base layer 2. The dye base layer 2 forms a predetermined filter pattern. The dye base layer 2 is colored by dye having a predetermined spectral characteristics. A clear anti-dyeing material is applied over the solid state imaging device to form an anti-dyeing layer 3 which is not dyed by any dye (see FIG. 1 (a)).

As shown in FIG. 1 (b) and in a manner the as same as above mentioned, the photosensitive liquid is applied over the anti-dyeing layer 3 and is dried to form another photosensitive layer. The photosensitive layer is selectively exposed to light through a photo mask (not shown). The photosensitive layer is developed to form a second dye base layer 4. The second dye base layer 4 is colored by another dye having predetermined spectral characteristics. The anti-dyeing material is then applied over the second dye base layer 4 to form a clear anti-dyeing layer 5.

As shown in FIG. 1 (c), the photosensitive liquid is applied over the anti-dyeing layer 5. The photosensitive liquid is dried to form the photosensitive layer. The photosensitive layer is selectively exposed to light through a photo mask and is developed to form a third dye base layer 6. The third dye base layer 6 is colored by a different dye having predetermined spectral characteristics. Finally a top coat layer 7 is provided over the entire colored layer to form the color filter.

However such a conventional method of manufacturing the color filter has the following drawbacks.

1. The first dye base layer 2 and the second and third dye base layers 4 and 6 are disposed on different surfaces. The first dye base layer 2 is provided directly on the surface of the solid state imaging device. In turn the second and third dye base layers are formed on the anti-dyeing layers 3 and 5 respectively. The adhesive strength of the photosensitive layer differs for different substances. For instance some photosensitive layers strongly adhere to the surface of the solid state imaging device (generally made of $SiO_2$ film) while the same photosensitive layers are easily removed from the anti-dyeing layer.

2. The anti-dyeing layers 3 and 5 cause positional differences among the first, second and third dye base layers in the film thickness direction. Such positional differences reduce the resolution of the color filter pattern. Therefore the pattern of the second and third dye base layers is not sharp.

3. Uneven surface of the solid state imaging device prevents the uniform application of the photosensitive liquid so that the thickness of the dye base layer is not kept constant. Namely, the color density of the color filter is not constant. For to the same reason, it is difficult to form an accurate dyed region of mosaic or stripe-shape.

4. The light exposure process is required three times. The process is complicated and requires many steps so that cost reduction is difficult to achieve.

The second conventional method of manufacturing the solid state color imaging device is illustrated in FIGS. 2 (a) to (d). As shown in FIG. 2 (a), a dyeable resin is applied over the surface of the solid state imaging device 1 by a roll coat method, dipping method or spinner method to form a dye base layer 2.

Next as shown in FIG. 2 (b), a photoresist layer is formed on the dye base layer 2.

The photo-resist layer is photo-etched to form a first dyeing mask 8 which has openings in a predetermined pattern. The dye base layer 2 is selectively dyed through the mask openings by a first dye having predetermined spectral characteristics to form a first color filter layer 21.

Next as shown in FIG. 2 (c), a second dyeing mask 8' having openings is formed by the light exposure method. The dye base layer 2 is selectively dyed through the second mask openings by a second dye having predetermined spectral characteristics to form a second color filter layer 22. The process is then repeated a third time and a third color filter layer 23 is formed to constitute the color filter as shown in FIG. 2 (d).

This manufacturing method, in comparison with the first conventional manufacturing method, directly forms the dye base layer on the solid state imaging device and thus eliminates the positional difference among different color filter layers. Therefore the drawbacks 1 and 2 of the first conventional manufacturing method may be removed. However, the drawbacks 3 and 4 of the first conventional manufacturing method also exist in the second conventional method. Further, according to the second conventional method, the first, second and third color filter layers 21, 22 and 23 are formed closely adjacent one other so that the dye tends to diffuse into the adjacent regions. Therefore the different colors become mixed together.

SUMMARY OF THE INVENTION

Accordingly the present invention aims to eliminate the aforementioned drawbacks of the conventional methods. It also aims to provide a method of manufacturing a solid state color imaging device having a color filter which has a fine resolution of the pattern, and precise differently colored regions without color mixture between adjacent differently colored regions. To realize the above objects a plurality of transparent electroconductive layers are formed on the solid state imaging device. Then the color filter is manufactured by forming a colored layer on the transparent electroconductive layers by co-electrodepositing a coloring material and polymer from a solution in which polymers and coloring materials or matter are dispersed.

In this method, the transparent electroconductive layers are formed in desired patterns by etching using a mask, and then polymers and coloring matter are selectively electrodeposited on the electroconductive layers to which a voltage is applied, whereby colored layers without shear of the pattern position can be formed. Since the colored layers electrodeposited by this method never overlap each other, a color filter can be easily realized on the solid state imaging device by repeating this operation.

BRIEF EXPLANATION OF THE DRAWING

FIG. 1 and FIG. 2 show process flow charts of conventional methods of manufacturing solid state color imaging devices.

DETAILED DESCRIPTION OF THE INVENTION

Figure 3A:
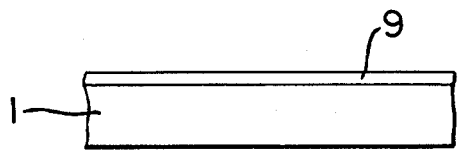
FIG. 3 and FIG. 4 show process flow charts of methods of manufacturing solid state color imaging devices according to the present invention.

Hereinafter a method for forming a colored layer by electrodeposition of polymers, which is an important feature of the present invention, will be illustrated. One of the methods for electrodepositing polymers on an electrode is a method for polymerizing a monomer on an electrode electrochemically. It has been reported that a polymer coating has been obtained by polymerizing various vinyl compounds on an iron plate electrochemically ("Hinzoku Hyomen Gijutsu" Vol. 19, No. 12, 1968). Recently, research on producing an alectroconductive polymer, such as poly(2, 5-pyrrole) or poly(2, 5-thienyline) by electrochemically polymerizing pyrrole or thiophene on an electrode has been actively carried out. The above method for electrochemically polymerizing a monomer directly, however, has certain drawbacks; namely, it is still inefficient and lacks in option of coloration since the resultant film is already colored.

Another method for electrodepositing a polymer is to extract an insoluble polymer from a polymer solution on an electrode. By way of example, an electrodeposition coating method has been known in industrial fields, in which a colored layer is electrodeposited on a metal which serves as an electrode by being immersed in a polymer solution in which a pigment is scattered. The electrodeposition coating method is used for precoating on an automobile body, etc. The principle of this method is as follows: a hydrophilic group, such as a carboxyl group is introduced to a polymer; the carboxyl group is neutralized and solubilized with inorganic alkali, organic amine or the like; an electrode is immersed in the solubilized polymer solution and when a voltage is applied, a carboxyl-anion dissociated in the solution is electrophoresed toward a positive electrode and reacts with a proton produced by an electrolysis of water on the electrode; and a polymer is insolubilized and extracted. Namely the reaction of the following equation is shown on the positive electrode and a polymer is extracted.

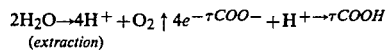
(extraction)

Reversely, when a basic group (e.g. poly-amine) is used for the hydrophilic group to be neutralized and solubilized by acid, a polymer is extracted on the negative electrode. In case the electrodeposited polymer has an electrically insulating characteristic, the electrodes are coated with polymer and the current is reduced, whereby an increase in the film thickness would not be expected to prevent the electrodes from being coated with polymer. Actually, however, the complete coating of polymer at the initial stage can be prevented by air bubbles of oxide evolved by the electrolysis of water, and some film thickness is obtained before an insulating layer of the polymer is formed. In the electrodeposition coating, generally, a colored layer of 10–20 μm thick is obtained by an applied voltage of 100–200.V. However, it is desirable that the colored layer of a color filter according to the present invention be much thinner, preferably less than 2 μm. For that the, potency of the resin, the voltage and the solvent composition should be settled at the optimum values as will be illustrated in the following embodiments. A polymer film thus produced contains less water by the effect of an electrical osmosis, whereby a uniform film with more excellent fitness than a film formed by an application method, etc. is obtained.

By way of a polymer for anionic electrodeposition, an addition compound of natural drying oil with maleic acid, an alkyd resin incorporating carboxyl group, an addition compound of epoxy-resin with maleic acid, a polybutadiene resin incorporating carboxyl group, a co-polymer of acrylic acid or methacrylic acid with its ester, or the like is used. Organic compounds having other polymer or functional groups may be sometimes incorporated into a polymer structure by the feature of the electrodeposition coating. In case light is to be viewed through a color filter as in this invention, transparency is required for the colored layer, and acrylic-polymer or polyester-polymer satisfies this requirement. The amount of the hydrophilic group such as carboxyl group, hydroxyl group or the like in the polymer is important: if the amount of the hydrophilic group is too large, the insolubilization of the electrodeposition layer is insufficient and a non-uniform film is formed; while, if the amount of the hydrophilic group is too small, the solubility in case of neutralization becomes insufficient. Although the solvent of a polymer is mainly of water, hydrophilic solvent such as isopropyl alcohol, n-butyl alcohol, tert-buthyl alcohol, methyl cellosolve, ethyl cellosolve, isopropyl cellosolve, buthyl cellosolve, diethylene glycol methyl ether, diethylene glycol ethyl ether, or diacetone alcohol is also contained as the solvent for polymerizing the polymer. The kind and amount of the contained hydrophilic solvent also has a large effect on the uniformity of the film and the thickness of the electrodeposition layer.

In the electrodeposition coating, a pigment is used for coloration, in which an electrified pigment is electrophoresed together with the polymer and taken in the film. In case of a color filter with transparency according to the present invention, the hiding power of the pigment is not needed, and the filter may lack in tinting strength when the film thickness is reduced. Accordingly, the present invention has worked out of a method for electrodepositing a dye with a polymer. For electrodepositing the dye with the polymer, dye molecules should be electrified and electrophoresed. In case of soluble dye, a dissociated dye ion serves as a current medium and followed by increases in current and film thickness and the non-uniformity of the film. Although insoluble dyes ordinarily cohere in water, the electrodeposition polymer is regarded as a kind of soap having a hydrophobic group and a hydrophobic group which disperse to some extent relative to the organic dye molecules and can be fined down into powder by being combined with a suitable disperse solvent and can be electrodeposited together with polymer. In this case, the electrodeposition velocities of the dye and the polymer, which should be the same degree, can be controlled by the composition of the solution.

Hereinafter a method of manufacturing a solid state color imaging device will be concretely illustrated in conjunction with several specific embodiments.

EMBODIMENT 1

Figure 3B:
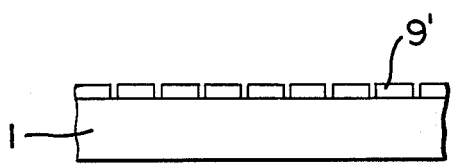
Figure 3C:
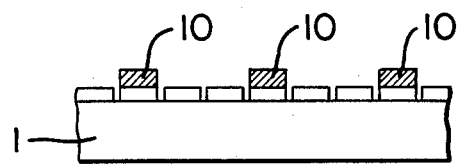
Figure 3D:
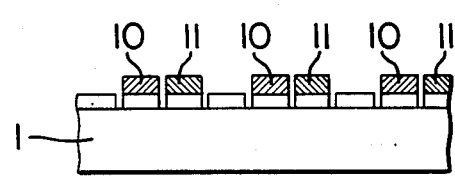
Figure 3E:
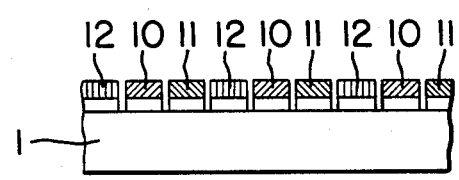

FIGS. 3 (a) to (e) are an embodiment of a method for manufacturing a solid state color imaging device according to the present invention.

1. Patterning Process

A transparent electroconductive layer 9 of tin oxide is formed by spattering on the solid state imaging devide 1, such as a charge-coupled device, bueket brigade devide and metal oxide semiconductor (see FIG. 3 (a)). The transparent electroconductive layer 9 is photo-etched with photo-resist to form a stripe transparent electrode pattern 9' see FIG. 3 (b)).

2. Electrodeposition Process

The following is the composition of a coating S-Via ED-3000 (registered trademark; manufactured by Sinto Coating Co., Ltd.):

| S-Via ED-3000 | |
|---|---|
| Material | wt % |
| Soluble polyester resin | 70 wt % |
| Soluble melamine resin | |
| Butylcellosolve | 30 wt % |
| ethylcellosolve | |
| n-butanol | |

The following is the composition of an electrodeposition bath using the S-Via ED-3000:

| Material | wt % |
|---|---|
| S-Via ED-3000 | 5 |
| Water | 120 |
| Methylcellosolve | 15 |
| Solvent dyes | x |

The solvent dyes employed are restricted to a soluble hydrophilic solvent, and preferably of metal complex salt structure with extremely excellent light resistance. There is a solvent dye with the following molecular structure.

(Name of product: Aizen Spilon, Oleosol Fast, etc.)
Cr complex salt of

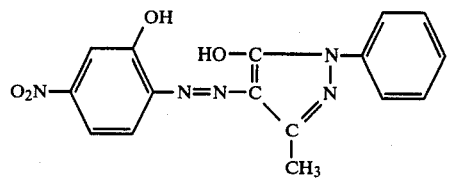

Color index No.: Solvent Red 8

The order of forming the electrodeposition bath is as follows: S-Via ED-3000 is dissolved in water; a dye is dissolved in methylcellosolve; wt% "x" of the dye is freely chosen within the range of not exceeding the solubility of the dye relative to the methylcellosolve; the methylcellosolve in which the dye is dissolved is added to the aqueous solution; and the dye is uniformly dispersed. At this time, although the methylcellosolve serves as a disperse solvent, an increase in the amount of additives of the methylcellosolve or an increase in the number of carbons of alkyl group of the cellosolve causes an increase in the film thickness and a resulting non-uniformity of the film.

The solid state imaging device 1 on which the transparent electrodes 9' are formed is immersed in the electrodeposition bath made as illustrated above. Transparent electrodes to be colored identically with the same color tone are selected from the transparent electrodes 9' which are patterned in the shape of stripes. A 10 V voltage is applied for 3 minutes using the selected electrodes as the positive electrode. A large current flows immediately after the voltage application, and the current gradually reduces to approach almost zero. After the voltage application, the solid state imaging device 1 is extracted to wash down sufficiently the solution deposited on the portions to which no voltage is applied. When the solid state imaging device 1 is dried after washing, a colored layer with excellent transparency is formed on the electrodes to which the voltage was applied (see FIG. 3 (c)).

3. Curing Process

A polyester resin and a melamine resin in the coloration layer formed by electrodeposition are cured by condensation reaction. When the resins are cured in air at 175° for 30 minutes, the colored layer is completely cured. The film thickness of the colored layer on this occasion is 1.5 μm.

The cured colored layer is a complete insulation layer which is never electrodeposited nor dyed even by being immersed and applied a voltage in the electrodeposition bath again. Therefore, the second and third colored layers are formed by repeating the processes of: selecting other transparent electrodes to be identically colored; electrodepositing the display electrodes in the electrodeposition bath in which dyes of different color tone are dispersed; and curing (see FIGS. 3 (d) (e)).

In this embodiment, stripe color filters formed on the solid state imaging device in the order of red, blue and green are manufactured by the following extremely simple method as; patterning process→electrodeposition process of a red filter→curing process→electrodeposition process of a blue filter→curing process→electrodeposition process of green filter→curing process. Since the transparent electrode layer is uniformly formed on the surface of the solid state imaging device without regard to the unevenness of the surface by the spattering method, very accurate patterning is possible. According to the present invention, the colored layer is formed solely on the transparent electrode layer so that the manufactured color filter has a very accurate pattern with high resolution. The problem of mixing colors between adjacent colored layers is eliminated. The adhesive strength between the colored layer and the transparent electrode layer is good. The transparent electrode layer can also be formed by an evaporating method and spray coat method to obtain the same effect.

EMBODIMENT 2

A coating POWERMITE 3000-10 (trademark; manufactured by Nihon Paint Co., Ltd.) of the following composition is used for the electrodeposition bath in the embodiment 1.

| POWERMITE 3000-10 | |
|---|---|
| Material | wt % |
| Soluble acrylic resin | 60 wt % |
| Soluble melamine resin | |
| Butylcellosolve | 40 wt % |
| Isopropyl alcohol | |

The following is the composition of the electrodeposition bath using the POWERMITE 3000-10:

| Material | wt % |
|---|---|
| POWERMITE 3000-10 | 10 |
| Water | 120 |
| Ethyleneglycol | 20 |
| Disperse dyes | x |

The disperse dyes on the market to be used often contain an anionic disperse agent. Since the disperse agent changes into ions in the bath and causes the current value to be enlarged, it is desirable that the electrodeposition bath does not contain the disperse agent. The adjusting method for the electrodeposition bath: the disperse dyes are uniformly dispersed in ethyleneglycol within the range of ×1.5 and added to the solution in which the POWERMITE 3000-10 is dissolved in water.

A solid state color imaging device in the embodiment 2 has a similar effect to the embodiment 1.

EMBODIMENT 3

The composition of the electrodeposition bath in the embodiment 1 is changed as follows:

| Material | wt % |
|---|---|
| S-Via ED-3000 | 20 |
| Water | 120 |
| Solvent dyes | x |

The adjusting method for the bath: the solvent dyes are added to the S-Via ED-3000 within the range of ×<1.0 and uniformly dispersed by the kneading method, ultrasonic wave method, etc. After that, water is added to make the electrodeposition bath. Since the polymers in the electrodeposition bath are of high density, the colored layer is of 20 μm thick.

EMBODIMENT 4

Figure 4A:
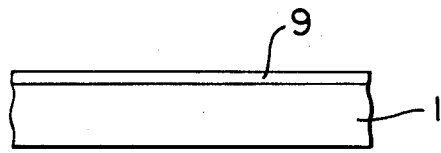
Figure 4B:
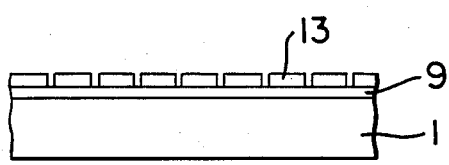
Figure 4C:
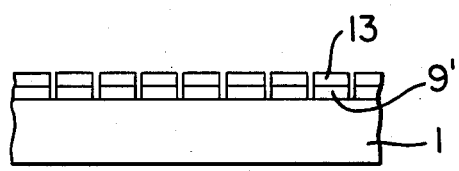
Figure 4D:
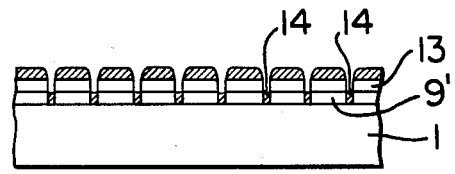
Figure 4E:
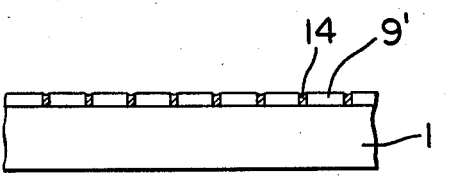

A step of forming a light-absorbent or light-cutting layer is added to the transparent electrode patterning process. The process is shown in FIG. 4 (a) to (e) in detail.

1. A transparent electroconductive layer 9 is formed on the entire surface of the solid state imaging device (see FIG. 4 (a)).

2. A photo-resist resin is applied over the transparent electroconductive layer 9 to form the photo-resist layer. The photo-resist layer is selectively exposed to light and developed to form a mask 13 (see FIG. 4 (b)).

3. The transparent electroconductive layer 9 is etched through the mask 13 to form stripe-shape electrodes (see FIG. 4 (c)).

4. A resin 14 containing black dye is applied over the solid state imaging device and dried to form the insulating light-absorbent or light-cutting layer (see FIG. 4 (d)).

5. The photo-resist mask 13 is removed from the transparent conductive layer together with the light-absorbent or light cutting layer (see FIG. 4 (e)).

After that, the same steps as in embodiment 2 are done to obtain the solid state color imaging device having the light-cutting layer formed between the colored layers by simply adding a step of the light-cutting layer application.

Further, a light-cutting or light-absorbent layer may be formed by evaporating metal oxide or formed by dyeing black the dyeable resin layer applied over the solid state color imaging device.

EFFECT OF THE INVENTION

As described above, according to the present invention the transparent electroconductive layer is formed on the solid state imaging device. The color filter is electrodeposited from the solution containing and dispersing the electrodepositing polymer and the coloring matter on the transparent electroconductive layer which serves as the electrodeposition electrode.

Conventionally the dyeable resin is applied over the solid state imaging device by the spinner coat method, dipping method and so on. Because of the unevenness of the surface of the solid state imaging device, the dyeable resin is not uniformly applied to the solid state imaging device. Such a drawback causes lack of color uniformity of the color filter and lack of pattern accuracy. According to the present invention, the transparent electroconductive layer is formed by a spattering method, evaporating method and so on so that the electroconductive layer is uniform regardless of the degree of unevenness of the surface of the solid state imaging device. Quite an accurate pattern of the transparent electroconductive layer is obtained. Accordingly the color filter electrodeposited on the transparent electroconductive layer is also precise and uniform. The drawbacks of the conventional manufacturing method such as lack of pattern accuracy, pattern resolution and color mixture between adjacent differently colored layers are effectively by the present invention. Further, with respect to the manufacturing process, the conventionally complicated light exposure step including mask alignment is required three times, while according to the present invention, only a single patterning step of the transparent electroconductive layer is required. The present invention thus offers a quite simple method of manufacturing the solid state color imaging device.

What we claim is:

1. A method of manufacturing a color filter comprising the steps of: providing a substrate; forming plural transparent electroconductive layers spaced apart and insulated from one another on the substrate; forming on the substrate a layer of light-absorbent material in the spaces between the spaced-apart electroconductive layers; and forming a colored layer on the electroconductive layers by co-electrodepositing a coloring material and polymer on the electroconductive layers.

2. A method of manufacturing a color filter according to claim 1; wherein the step of forming a layer of light-absorbent material comprises forming in the substrate a layer composed of resin containing black dye in the spaces between the spaced-apart electroconductive layers.

3. A method of manufacturing a color filter according to claim 1; wherein the step of forming a layer of light-absorbent material comprises evaporating a layer of metal oxide on the substrate in the spaces between the spaced-apart electroconductive layers.

4. A method of manufacturing a color filter according to claim 1; wherein the step of forming a layer of light-absorbent material comprises disposing a dyeable resin in the spaces between the spaced-apart electroconductive layers, and dyeing black the dyeable resin.

5. A method of manufacturing a color filter according to claim 1; wherein the step of providing a substrate comprises providing a substrate having formed thereon a plurality of imaging elements.

6. A method of manufacturing a multicolor filter comprising the steps of: providing a substrate; forming a pattern of transparent electroconductive layers spaced apart and insulated from one another on the substrate, the electroconductive layers being divided into groups; forming on the substrate a layer of light-absorbent material in the spaces between the spaced-apart electroconductive layers; co-electrodepositing a coloring material of one color tone and polymer on one group of electroconductive layers to form thereon a color filter of one color tone; and successively repeating the co-electrodepositing step using coloring materials of different color tones to form color filters of different color tones on respective ones of the other groups of electroconductive layers such that each electroconductive layer group has color filters of the same color tone which is different from the color tones of the other electroconductive layer groups.

7. A method of manufacturing a multicolor filter according to claim 6; wherein the step of forming a layer of light-absorbent material comprises forming on the substrate a layer composed of resin containing black dye in the spaces between the spaced-apart electroconductive layers.

8. A method of manufacturing a multicolor filter according to claim 6; wherein the step of forming a layer of light-absorbent material comprises evaporating a layer of metal oxide on the substrate in the spaces between the spaced-apart electroconductive layers.

9. A method of manufacturing a multicolor filter according to claim 6; wherein the step of forming a layer of light-absorbent material comprises disposing a dyeable resin in the spaces between the spaced-apart electroconductive layers, and dyeing black the dyeable resin.

10. A method of manufacturing a multicolor filter according to claim 6; wherein the step of providing a substrate comprises providing a substrate having formed thereon a plurality of imaging elements.

11. A method of manufacturing a multicolor filter according to claim 6; wherein the steps of forming a pattern of electroconductive layers and forming a layer of light-absorbent material comprise forming a transparent electroconductive layer on an entire surface region of the substrate, forming a photo-resist layer on the electroconductive layer, exposing the photo-resist layer to light and developing the exposed photo-resist layer to form a mask corresponding to the pattern of spaced-apart electroconductive layers, removing by etching the portions of the electroconductive layer which are not covered by the mask to form the pattern of electroconductive layers, forming a layer of light-absorbent material over the mask and in the spaces between the spaced-apart electroconductive layers, and removing the mask to thereby leave on the substrate the pattern of electroconductive layers with the layer of light-absorbent material in the spaces between the electroconductive layers.

* * * * *